United States Patent
Moser et al.

(10) Patent No.: US 8,619,429 B2
(45) Date of Patent: Dec. 31, 2013

(54) CONTROL UNIT FOR OCCUPANT PROTECTION MEANS FOR A VEHICLE AND A METHOD FOR ASSEMBLING A CONTROL UNIT OF THIS TYPE

(75) Inventors: Manfred Moser, Reutlingen (DE); Mark Wonner, Mundelsheim (DE); Roland Cupal, Markgroeningen (DE)

(73) Assignee: Robert Bosch GmbH, Stuttgart (DE)

( * ) Notice: Subject to any disclaimer, the term of this patent is extended or adjusted under 35 U.S.C. 154(b) by 68 days.

(21) Appl. No.: 13/002,456

(22) PCT Filed: May 4, 2009

(86) PCT No.: PCT/EP2009/055358
§ 371 (c)(1),
(2), (4) Date: Oct. 14, 2011

(87) PCT Pub. No.: WO2010/000523
PCT Pub. Date: Jan. 7, 2010

(65) Prior Publication Data
US 2012/0063104 A1 Mar. 15, 2012

(30) Foreign Application Priority Data
Jul. 3, 2008 (DE) .......................... 10 2008 040 156

(51) Int. Cl.
*H05K 5/00* (2006.01)
(52) U.S. Cl.
USPC ............................ 361/757; 361/752; 361/736
(58) Field of Classification Search
USPC ........................... 361/757, 752, 736, 753, 739
See application file for complete search history.

(56) References Cited

U.S. PATENT DOCUMENTS

| 5,761,046 A | 6/1998 | Hein et al. |
| 6,213,495 B1 | 4/2001 | Plankl et al. |
| 6,217,377 B1 | 4/2001 | Nishizawa |
| 6,497,368 B1 * | 12/2002 | Friend et al. ............. 235/472.01 |
| 6,573,448 B2 | 6/2003 | Mayer et al. |
| 2001/0046128 A1 * | 11/2001 | Ogata ........................... 361/800 |
| 2008/0220324 A1 * | 9/2008 | Phillips et al. ................ 429/120 |

FOREIGN PATENT DOCUMENTS

| CN | 1185088 | 6/1998 |
| DE | 198 36 887 | 8/1998 |
| EP | 0717 588 | 10/1995 |
| EP | 0 927508 | 7/1997 |
| EP | 1263 274 | 4/2002 |
| RU | 13863 | 5/2000 |
| RU | 14 410 | 7/2000 |
| WO | WO 02/057118 | 7/2002 |

OTHER PUBLICATIONS

International Search Report, PCT International Patent Application No. PCT/EP2009/055358, dated Sep. 10, 2009.

* cited by examiner

*Primary Examiner* — Timothy Thompson
*Assistant Examiner* — Andargie M Aychillhum
(74) *Attorney, Agent, or Firm* — Kenyon & Kenyon LLP

(57) ABSTRACT

A control unit and a method for assembling a control unit for occupant protection means for a vehicle are described. A p.c. board is enclosed between a plastic cover and a plastic base and assembled. A non-positive and/or positive connection is implemented for this assembly, and the control unit is pre-attached. The at least one connection is produced without tools.

14 Claims, 3 Drawing Sheets

CONTROL UNIT FOR OCCUPANT PROTECTION MEANS FOR A VEHICLE AND A METHOD FOR ASSEMBLING A CONTROL UNIT OF THIS TYPE

FIELD OF INVENTION

The present invention relates to a control unit for occupant protection devices for a vehicle and a corresponding method for assembling a control unit of this type.

BACKGROUND INFORMATION

A method for screwing the p.c. board to the housing cover or the housing base prior to installation in the vehicle is described in European Patent No. 0 927 508 B1.

SUMMARY

An example control unit according to the present invention for occupant protection devices for a vehicle and the method according to the present invention for assembling the control unit for occupant protection devices for a vehicle may have the advantage that the p.c. board may be pre-attached to the plastic base and the plastic cover without tools. It is therefore not necessary to first screw the p.c. board onto the housing base or in connection with the housing cover. This greatly simplifies the assembly of the control unit. For this purpose, pre-attachment is provided, which is implemented, for example, simply by pressing the housing base, housing cover and p.c. board together. The connection may be designed as a positive and/or non-positive connection. No tools are necessary. Further advantages are the plastic design of the cover and base, which together form the housing.

In assembling this example control unit according to the present invention, SMD (surface mounted device) components, for example, are mounted on the p.c. board and subsequently soldered thereon in a reflow soldering process. By assembling the p.c. board, the plastic base, and the plastic cover, the pre-attachment is then accomplished by using clips, for example, to hold the housing together. The plastic cover and the plastic base together form the housing. Later, when the housing is to be used for installation, this installation is then accomplished, for example, by using screws, which pass through the plastic cover, through the p.c. board and also through the plastic base.

A control unit in the present case is a device which processes sensor signals and provides control signals as a function thereof. Occupant protection devices include, for example, an airbag, a seatbelt tensioner or a crash-active headrest. However, other personal protection devices, such as pedestrian safety systems, additional airbags, etc., fall in that category.

The accommodation of electrical components on the p.c. board means that a wide range of electrical or electronic components are mounted on the p.c. board to then attach them, in particular, using SMD technology. It is possible to use more than one p.c. board. The p.c. board provides the electrical components and the connections between these components provided thereupon. The p.c. board is also designed in the same manner as it is used for conventional electronic circuits.

The plastic cover and the plastic base are made from a plastic which offers electromagnetic compatibility (EMC). The following materials may be used for this purpose: PBT-GF30 and PA66 GF30. If necessary, an additive may be provided to improve electrical shielding properties, i.e., to improve the electromagnetic compatibility.

The plastic cover and the plastic base of the housing are adapted to each other so that they represent a housing in the assembled state.

The non-positive and positive connection provides the pre-attachment and does not require any tools for implementing the non-positive and/or positive connection.

It may be advantageous to also pre-attach the p.c. board via the pre-attachment. This means that the pre-attachment applies not only to the housing, but also to the contents of the housing, namely the p.c. board.

A clip connection may be advantageously used for the at least one connection to implement the present invention. Alternatives to clips may also be used, namely ultrasound welding, laser through-transmission welding, gluing, riveting and/or screwing.

Furthermore, it may be advantageous if at least one holder holds a p.c. board in the pre-attached position during pre-attachment. The holder may be mounted in the plastic cover and/or in the plastic base.

The at least one holder may be advantageously provided with an elastic force to support or press the at least one p.c. board in the pre-attached position. The positioning of the p.c. board is thus reliably maintained through transport from the factory of the control unit manufacturer to the auto manufacturer's premises.

Furthermore, it may be advantageous to provide the at least one holder with an elastic design and to press it against the at least one p.c. board using an appropriate elastic force so that the at least one p.c. board is held in the pre-attached position. This is a particularly efficient way to protect the p.c. board in the control unit against external influences. In particular, the impact resistance is greatly increased thereby. The holder may be provided with any type of elastic design. In particular, only one part of the holder may be provided with an elastic design.

A counter-holder may also be advantageously provided in the plastic base for the holder in the plastic cover to absorb the force. This increases the reliability of the control unit according to the present invention. In particular, the holder in the plastic cover may be provided with an elastic design, while the counter-holder in the plastic base has a rigid design.

In an advantageous manner, the at least one holder is partially passed through the p.c. board. An appropriate stop must then be provided to enable the spring to apply its appropriate forces to the p.c. board. Accordingly, the stop is situated in such a way that the holder may not be passed any further through the p.c. board. The stop is therefore larger than the hole in the p.c. board through which the holder projects. In particular, however, it is advantageous if the entire assembly may be carried out without tools.

It may be further advantageous if the at least one p.c. board, the plastic cover and the plastic base are designed in such a way that the control unit may be installed in the vehicle using at least one connecting element. This means that the plastic cover and the plastic base each have a bushing, and the p.c. board has at least one hole. A connecting element, such as a screw, a bolt or a rivet, may thus pass through this opening to fasten the three elements to each other. If the connecting element is conductive, a ground connection may additionally be provided between the p.c. board and the vehicle body.

BRIEF DESCRIPTION OF THE DRAWINGS

Exemplary embodiments of the present invention are illustrated in the figures and explained in greater detail below.

DETAILED DESCRIPTION OF EXAMPLE EMBODIMENTS

Figure 1:
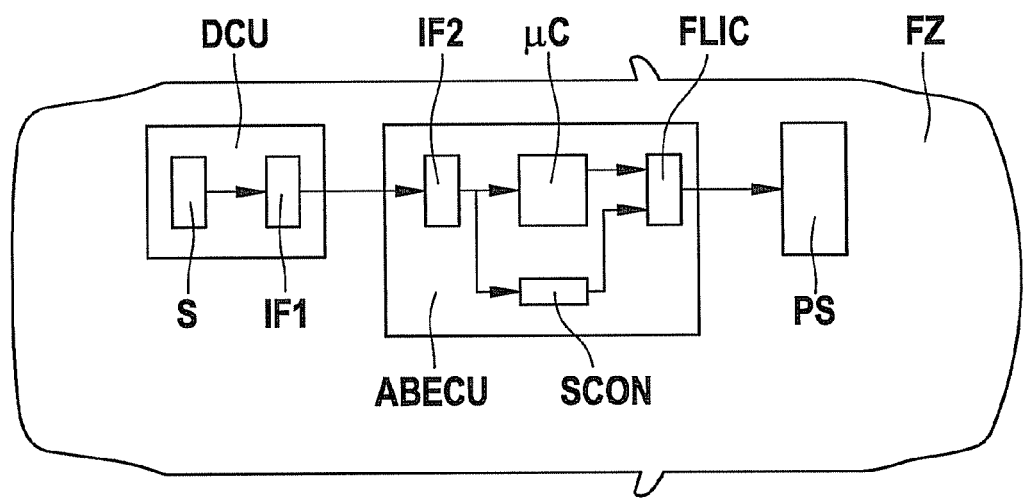
FIG. 1 shows a block diagram of an example control unit according to the present invention, including connected components.

In a block diagram, FIG. 1 shows an example control unit ABECU according to the present invention in vehicle FZ, including the connected components: sensor control unit DCU and occupant protection device PS. In this case, only some of the components of control unit ABECU are illustrated. In their entirety, the circuits are more complex and include more modules.

In the present case, sensor signals are transmitted from sensor system S, for example an acceleration sensor system in sensor control unit DCU, via interface IF1 to control unit ABECU, and thus to interface IF2 in control unit ABECU. Among other things, interface IF2 converts the data with regard to the data format, so that these data may be transmitted within control unit ABECU to a microcontroller μC and a safety controller SCON. This transmission begins at interface IF2, for example via the so-called SPI (serial peripheral interface) bus. The two controllers calculate separate trigger algorithms, and the results are then compared with each other by the evaluation logic of circuit FLIC. If this evaluation indicates an activation situation, trigger circuit FLIC energizes ignition elements of occupant protection device PS to ensure a pyrotechnical triggering of the occupant protection means. An electricity-powered vehicle, which provides large electrical energy reserves, is also possible. Both microcontroller μC and safety controller SCON evaluate the sensor signals independently of each other and reach a trigger decision, safety controller SCON having a simpler design than microcontroller μC.

Figure 2:
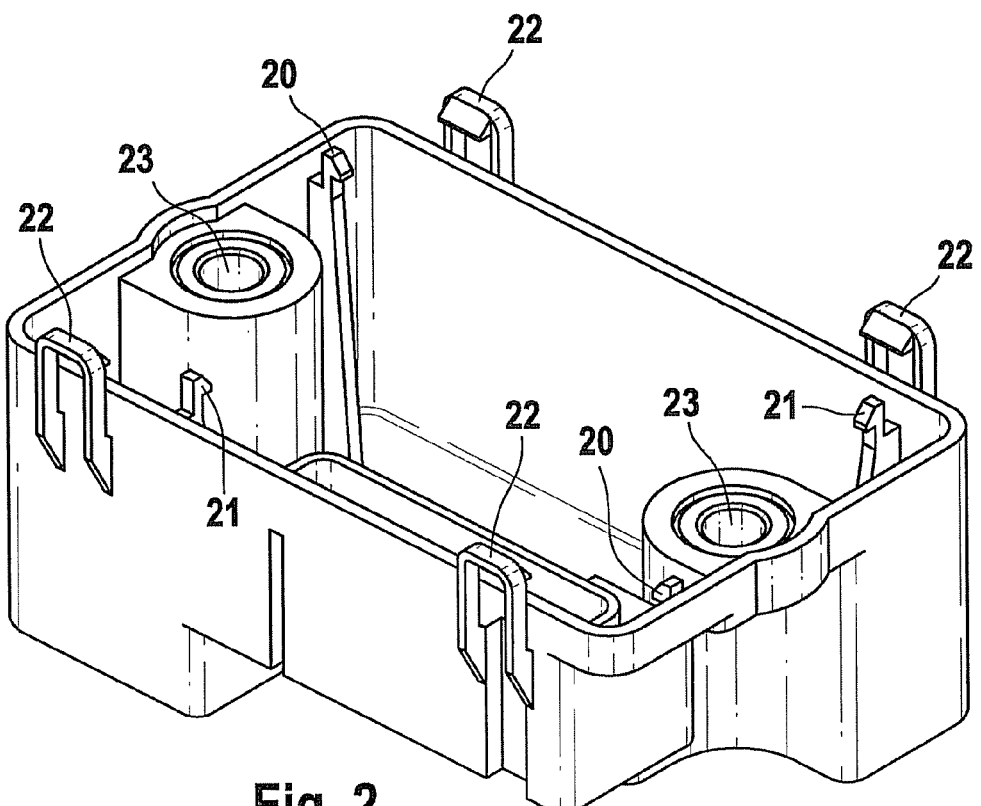
FIG. 2 shows a view of the interior of the example control unit.

FIG. 2 shows a perspective representation of the embodiment of the plastic holder. The plastic holder has springs 20 and 21, respectively, which are intended to hold the p.c. board in place. Clips 22 are also illustrated. Bushings 23, through which screws connect the housing to the motor vehicle in a non-positive manner, are also illustrated. The threads are situated in the vehicle chassis. In the present case, four springs 20, 21 are used. It is possible to use fewer than these four springs 20, 21.

Figure 3:
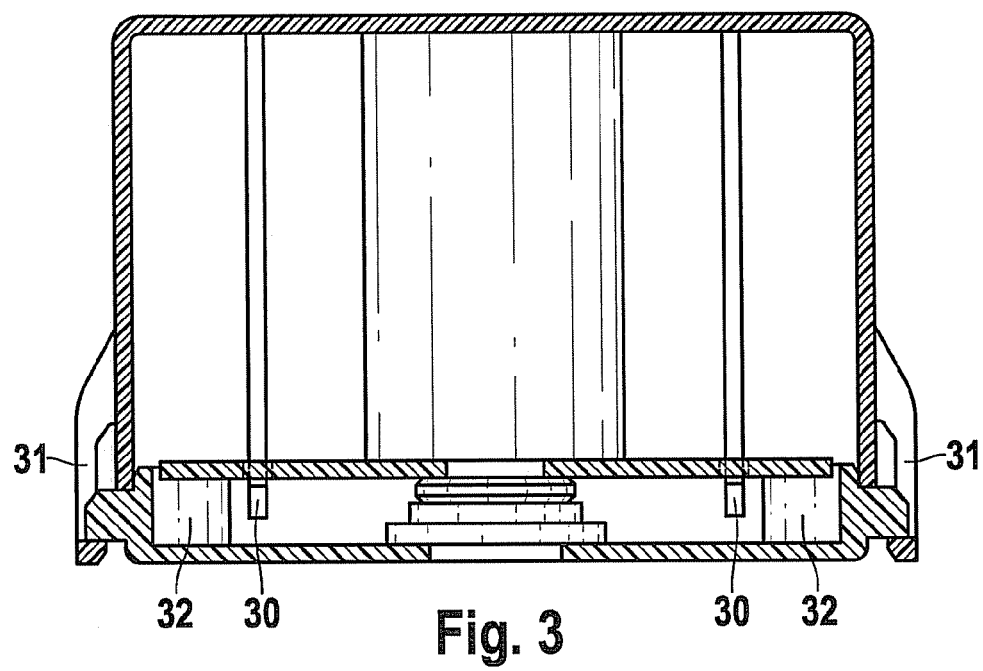
FIG. 3 shows a sectional representation of the example control unit according to the present invention.

FIG. 3 shows a sectional representation of the control unit according to the present invention, including two spring bars 30, which press against the p.c. board, clips 31, in turn, being illustrated as well as counter-elements 32 and spring bars 30, which hold the p.c. board in place.

Figure 4:
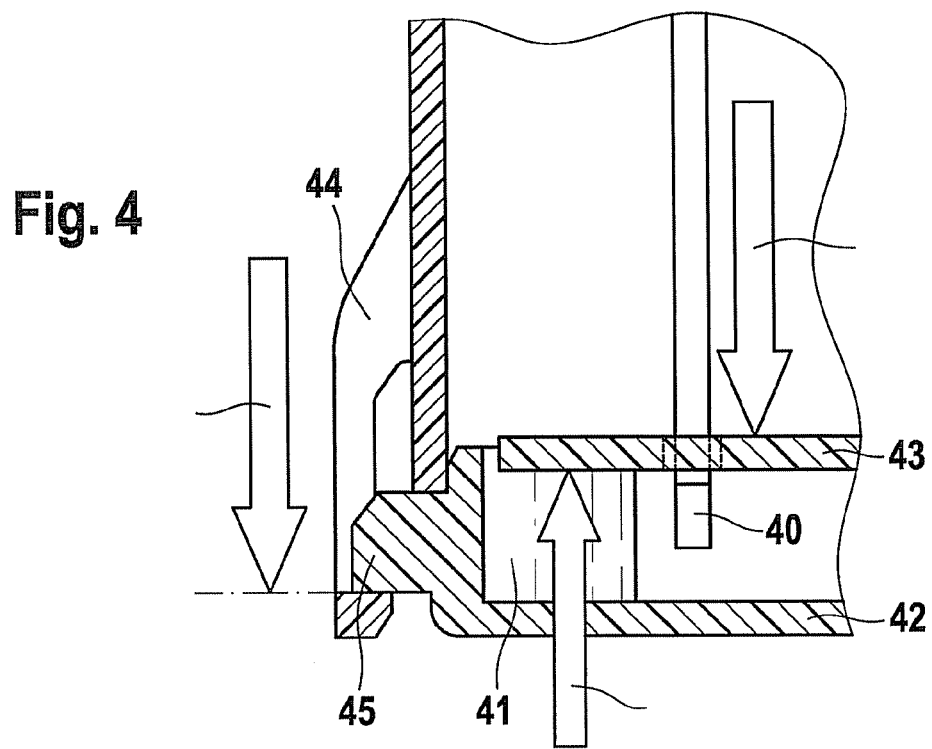
FIG. 4 shows the distribution of forces.

FIG. 4 illustrates the acting forces. Based on clip 44, clip force F_clip of the clip is applied to the control unit housing. However, elastic holder 40 also presses against p.c. board 43 using force F_spring, and counter-holder 41 presses against the p.c. board using counter-force F-support. Plastic base 42 and a clip part 45 are also illustrated.

Figure 5:
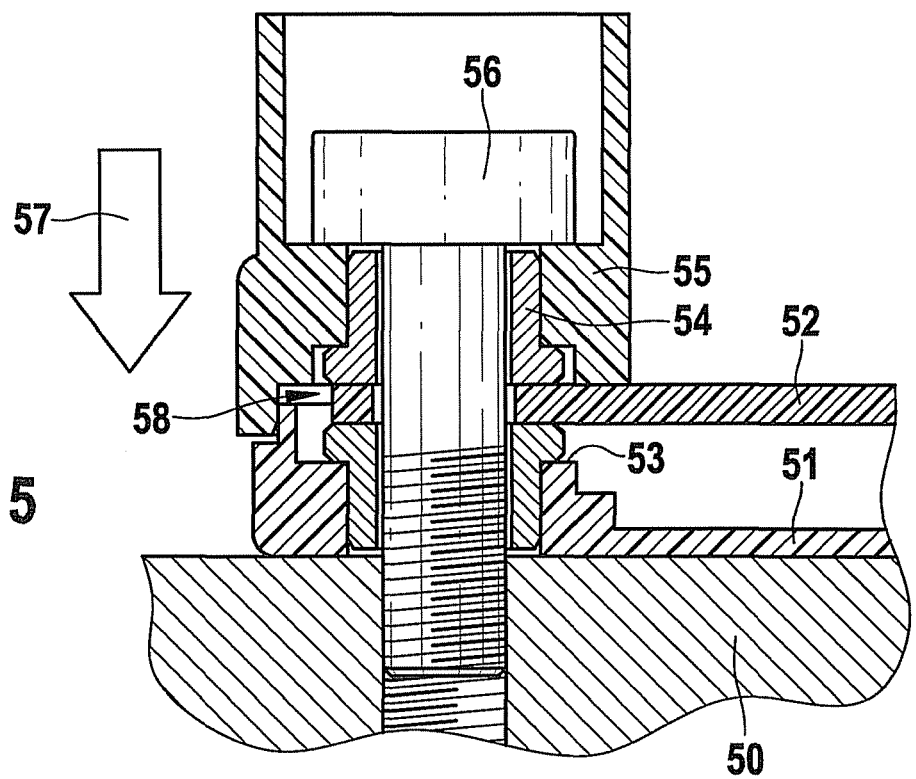
FIG. 5 shows a further sectional representation of the example control unit according to the present invention.

FIG. 5 shows a further sectional representation of the control unit according to the present invention. In the present case, only a detail is illustrated. The figure shows a housing cover 55, screws or bolts 56 as connectors, the relative movement on the basis of the press-in bushing and housing cover, a p.c. board clamp connection 58 or attachment, a pressed-in bushing 54, which enables screw 56 to be used, p.c. board 52 and housing base 51. Reference numeral 57 designates the direction in which the screw is inserted.

Figure 6:
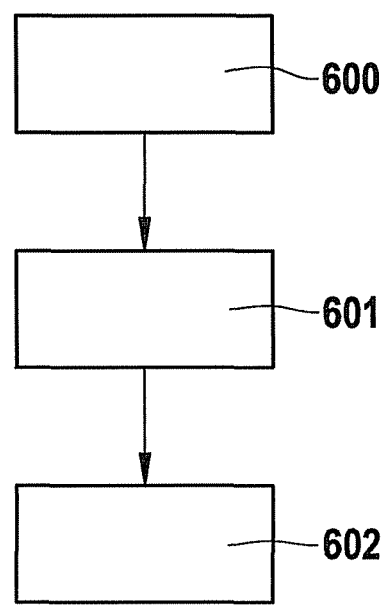
FIG. 6 shows a flow chart of an example method according to the present invention.

FIG. 6 shows a flow chart of the example method according to the present invention. Electrical or electronic components are mounted on the p.c. board in method step 600. The pre-attachment takes place in method step 601 by using clips in assembling the control unit. According to process step 602, installation in the vehicle takes place by using the appropriate connectors.

What is claimed is:

1. A control unit for an occupant protection device for a vehicle, comprising:
    at least one printed circuit board for accommodating electronic components;
    a housing of the control unit, the housing including a plastic cover and a plastic base, between which the at least one printed circuit board is situated;
    wherein:
        the housing is attachable to the vehicle using a connecting element that fastens the plastic cover, the plastic base, and the at least one printed circuit board to each other; and
        the plastic cover and the plastic base are attachable to each other, during a pre-attachment, which is prior to the attachment of the housing to the vehicle, by at least one connection between a first component and a second component, each of the first component and the second component being respectively integral with at least one of the plastic cover and the plastic base.

2. The control unit as recited in claim 1, wherein the at least one connection is at least one of a non-positive connection and a positive connection.

3. The control unit as recited in claim 1, wherein the first components is a clip, and the second component is a hook, the first component and the second component being connectable by snapping the clip into the hook.

4. The control unit as recited in claim 1, wherein:
    at least one spring is integral with one of the plastic cover or the plastic base and is arranged to hold the at least one printed circuit board in a pre-attached position during the pre-attachment; and
    the housing includes at least one bushing through which the housing is attachable to the vehicle.

5. The control unit as recited in claim 4, wherein the at least one spring presses against the at least one printed circuit board using an elastic force so that the at least one printed circuit board remains in the pre-attached position prior to the attachment of the housing to the vehicle.

6. The control unit as recited in claim 4, wherein the at least one spring is situated in the plastic cover and is arranged to cooperate with a counter-holder situated in the plastic base.

7. The control unit as recited in claim 6, wherein the at least one spring partially projects through the printed circuit board.

8. The control unit as recited in claim 1, wherein the connecting element is configured to connect the at least one printed circuit board to a vehicle ground.

9. A method for assembling a control unit for an occupant protection device for a vehicle, comprising:
  situating at least one printed circuit board between a plastic cover and a plastic base of a housing of the control unit; and
  prior to an attachment of the housing to the vehicle, pre-attaching the plastic cover and the plastic base to each other by at least one connection between a first component and a second component, each of the first component and the second component being respectively integral with at least one of the plastic cover and the plastic base.

10. The method as recited in claim 9, wherein the at least one connection is at least one of a non-positive and positive connection.

11. The method as recited in claim 9, wherein:
  at least one spring is integral with at least one of the plastic cover and the plastic base, and holds the at least one printed circuit board in a pre-attached position during the pre-attachment; and
  the housing includes at least one bushing through which the housing is attachable to the vehicle.

12. The method as recited in claim 9, further comprising:
  subsequent to the pre-attaching, attaching the housing to the vehicle using a connecting element that fastens the plastic cover, the plastic base, and the at least one printed circuit board to each other.

13. A control unit for an occupant protection device for a vehicle, comprising:
  at least one printed circuit board for accommodating electronic components; and
  a housing including a plastic cover and a plastic base, between which the at least one printed circuit board is situated and that are attached to each other by at least one of a welded connection and an adhesive connection, the housing being configured for the attachment of the plastic cover and the plastic base to each other prior to installation of the housing in the vehicle.

14. The control unit of claim 13, wherein, for the installation of the housing in the vehicle, the housing is configured to be attached to the vehicle using a connecting element that fastens the plastic cover, the plastic base, and the at least one printed circuit board to each other.

\* \* \* \* \*

UNITED STATES PATENT AND TRADEMARK OFFICE
CERTIFICATE OF CORRECTION

PATENT NO.        : 8,619,429 B2
APPLICATION NO.   : 13/002456
DATED             : December 31, 2013
INVENTOR(S)       : Moser et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 382 days.

Signed and Sealed this
Twenty-second Day of September, 2015

Michelle K. Lee
*Director of the United States Patent and Trademark Office*